Feb. 19, 1963 L. E. JONES 3,078,328
SOLAR CELL
Filed Nov. 12, 1959

INVENTOR
Lloyd E. Jones
BY Stevens, Davis, Miller & Mosher
ATTORNEYS 3,078,328

SOLAR CELL

Lloyd E. Jones, Dallas, Tex., assignor to Texas Instruments Incorporated, Dallas, Tex., a corporation of Delaware Filed Nov. 12, 1959, Ser. No. 852,536
6 Claims. (Cl. 136—89)

Figure 1:
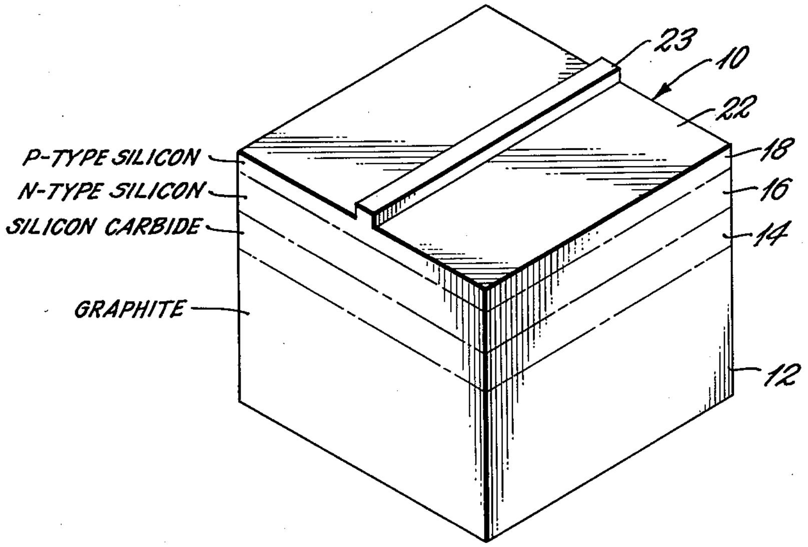

This invention relates to photovoltaic cells, for converting light radiation into electrical energy, and more particularly to an improved silicon solar cell and methods of fabrication.

The recent successful use of solar cells to power a radio transmitter in an orbiting satellite has emphasized the increased utilization of solar cells. The factors which affect efficiency are such that the maximum obtainable energy conversion efficiency is approximately 15% for the solar cells presently in use. One of the factors which affects the conversion efficiency is the size of the cell. As the cells are made larger, the efficiency is decreased appreciably. Because of this, the cells in present use are normally only from one to four square centimeters in surface area. As the amount of energy incident upon such a small area is very small and as only a relatively small percentage of this energy is converted to useful energy, it is necessary to use large numbers of cells either in series or series-parallel arrangements. Accordingly, it is very desirable that the cost of producing the individual solar cells be reduced to a minimal value.

At the present time, the method of manufacture of solar cells generally followed is to first grow a crystal of silicon doped to appropriate resistivity using methods that are well known in the art. The silicon crystal may be either of single crystalline or polycrystalline structure. This crystal is then sawed or cut into wafers. A PN junction is then formed in each wafer, normally by diffusion processes. Appropriate alloy contacts are formed on the wafer and the cells of desired size are cut from the wafer.

An appreciable part of the cost of a silicon solar cell is in the material or in the material preparation; i.e., the cost of the initial raw material and the cost of growing the crystal which is to be used. As only approximately 50% of the initial material which is fed into the process is recovered as usable units due to cutting or sawing losses, a method for fabrication of solar cells which utilizes a larger percentage of the silicon without an attendant loss in the energy conversion efficiency would be of great value.

In the present invention, a method is provided for the economical fabrication of solar cells in which there is a maximum utilization of the silicon material. According to the present invention, a unique way has been found to form a layer of silicon directly onto a conductive wafer such as graphite.

The layer of silicon is formed directly from a silicon melt without first forming a solid silicon member from which a wafer is cut. This technique obtains the fullest use of the silicon and avoids losses of silicon which would otherwise be experienced in cutting a wafer from a solid block or slab of silicon.

Silicon will not form a satisfactory attachment to graphite in a direct intimate contact. This difficulty is overcome by first forming a silicon carbide layer on the graphite and superposing a thin silicon layer on the silicon carbide. The PN junction and ohmic connections are then formed in conventional fashion in the silicon layer.

Accordingly, it is one object of the present invention to provide a silicon solar cell embodying a layer of silicon characterized by a PN junction and bonded to a mechanically strong low resistivity graphite base by an intermediate layer of low resistivity silicon carbide.

A further object of this invention is to provide a novel method for mass fabricating unit solar cells at reduced cost but without any appreciable decrease in the energy conversion efficiency.

Figure 2:
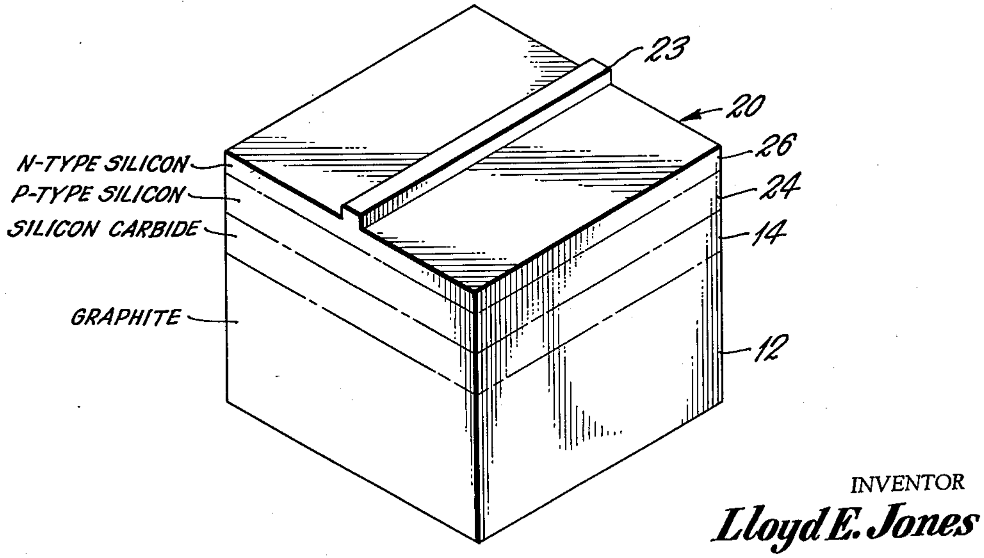

The novel features that are considered characteristic of the invention are set forth with particularity in the appended claims. The invention itself, however, both as to its organization and its methods of operation, together with additional objects and advantages thereof, will best be understood from the following description of a specific preferred embodiment when read in conjunction with the accompanying drawings, wherein like reference characters indicate like parts throughout the several figures, and in which:

FIGURE 1 is a greatly enlarged perspective view of a solar cell constructed in accordance with the present invention; and FIGURE 2 is a view similar to FIGURE 1, but showing a modified embodiment of the invention.

Referring now to the drawings, the preferred contemplated mode for carrying out the invention will now be described. FIGURE 1 shows a solar cell 10 which comprises a mechanically strong conductor base 12 formed of graphite having a very low electrical resistance. To impart strength and rigidity, the base 12 is preferably made at least 100 mils thick. Bonded to the graphite base 12 is a graded layer 14 of silicon carbide having a resistivity at 25° C. of less than 0.1 ohm-centimeter. Bonded to the layer 14 of silicon carbide is a thin layer 16 of silicon doped with an N-type impurity to provide a resistivity of approximately 0.1 ohm-centimeter. The layer 16 is preferably less than 3 mils thick. A layer 18, preferably less than 0.1 mil thick, is formed in the upper surface of layer 16 by the diffusion into the layer 16 of a P-type impurity by a conventional diffusion process. The layer 18 will preferably have a resistivity of approximately 0.005 ohm-centimeter. A thin strip 23 of copper, aluminum, platinum, or other suitable conductor material is formed on surface 22 in ohmic contact with the P-type conductivity layer 18. It is necessary that the strip 23 be very narrow in width in order that a minimum amount of the surface area 22 be masked from the incident radiation.

The construction described above provides a PN junction very close to the upper surface 22 which is the surface intended by design to receive the incident light radiation. Hence, the photons of the incident light radiation striking surface 22 act to create electron-hole pairs at or near the PN barrier with a minimum of loss from recombination of the electron-hole pairs. The thinness of the P and N layers minimizes the internal resistance losses of this cell. The silicon carbide layer 14, the low resistance graphite base 12, and the conductor strip 23 provide low resistance ohmic connections to an external load or battery. In making such connections, spring contacts or clamps may be applied to the bottom and/or sides of the base 12 and to the conductor strip 23. These conductive areas also provide means for connecting the cells in series or series parallel arrangements, as required.

The solar cell 20 illustrated in FIGURE 2 is, in all respects, similar to that shown in FIGURE 1 except that a P-type silicon layer 24 is formed directly on the silicon carbide layer 14. A thin N-type layer 26 is formed by diffusion into the P-type region.

The cells 10 and 20 described above can be fabricated in the following manner. A graphite wafer (wafer 12) is formed to the desired size and shape. The graphite wafer is then immersed in a melt of silicon having a desired resistivity for a short period of time. During the time the graphite is immersed in the silicon melt, the graphite, which is carbon, will combine with the silicon to form a layer of silicon carbide (layer 14). Because the small graphite wafer provides a heat sink, and because of the very short time in which the graphite wafer is immersed in the silicon melt, a thin layer of the silicon (layer 16 or layer 24) will freeze on the wafer and remain there when the wafer is removed from the melt. The period of time the graphite wafer remains in the silicon melt is important. If the period of time is too long, the graphite wafer will completely dissolve in the silicon melt. The required time interval will depend upon the temperature of the silicon melt, the wafer size, the desired thickness of silicon carbide, and the desired thickness of the silicon. The exact immersion time must be determined on the basis of an actual set of working conditions for a particular application, but let it suffice to say that it will be a very short time; in other words, less than one second.

After the layers of silicon carbide and silicon have been formed on the graphite wafer, the wafer is then subjected to a diffusion process, such as is well known in the art, to form the very thin outer layer (layer 18 or layer 26). The wafer may then be lapped to re-expose the graphite region. Alternatively, the graphite wafer may initially be chosen of such thickness that the coated wafer may be sliced within the plane of the graphite layer to form two wafers which may be thereafter diced into solar cells. The conductor 23 can be formed on the wafer by any one of several well known means. A preferred method of performing this operation is to paint a narrow stripe or stripes, as required, on the wafer using a solution of metal and an organic compound serving as a binder, such as is marketed by Hanovia Metal Products Company under the trade name Platinum Bright. After painting the stripe of the solution on the wafer, the wafer is fired at a temperature between 650° and 800° C. in an oxygen atmosphere. During this firing operation, the organic binder is decomposed leaving the metal conductor bonded to the surface 22 of the silicon-graphite wafer. It must be observed that this solution is available in many different metals, such as platinum, gold, rhodium, copper, silver, and others, plus combinations of these. The completed wafer may then be diced into a number of cells of the desired size and shape.

It is to be observed that in fabricating solar cells using the method of this invention that there is no requirement for growing crystals of silicon material. Also, there is almost no silicon wasted. Thus, this invention provides a method for fabricating solar cells with a minimum expenditure in time and/or materials.

Materials other than graphite and silicon may be used. However, there are certain characteristics the conductor should have. The conductor should have an expansion coefficient equal to or greater than the expansion coefficient of the semiconductor. The material should have a melting point comparable to that of the semiconductor and should not react with the semiconductor at temperatures up to the melting point of the semiconductor. It is obvious the conductor should be capable of withstanding the thermal shock caused by immersion in the molten semiconductor material.

Although certain specific embodiments of the invention have been shown and described, it is obvious that many modifications thereof are possible. The invention, therefore, is not to be restricted except by the spirit of the appended claims.

What is claimed is:

1. A photovoltaic cell for converting light radiation into electrical energy comprising a graphite base, a layer of silicon carbide formed on one face of said base, a first layer of silicon of one-type conductivity formed on said layer of silicon carbide, and a second layer of silicon of opposite-type conductivity formed on said first layer of silicon to define a PN junction.

2. A photovoltaic cell for converting solar radiation into electrical energy comprising a graphite base, a layer of silicon carbide coating formed on one face of said base, and a layer of silicon having an N-type zone and a P-type zone contiguous therewith forming a PN junction formed on said coating of silicon carbide.

3. A photovoltaic cell for converting solar radiation into electrical energy as defined in claim 2 wherein said silicon N-type conductivity zone is adjacent to said silicon carbide coating.

4. A photovoltaic cell for converting solar radiation into electrical energy as defined in claim 2 wherein said silicon P-type conductivity zone is adjacent to said silicon carbide coating.

5. A photovoltaic cell for converting light radiation into electrical energy as defined in claim 1 wherein said second layer of silicon of opposite-type conductivity is a diffused layer.

6. The method for producing a photovoltaic cell which comprises the steps of forming a graphite wafer, immersing said graphite wafer in a melt of silicon of one conductivity type maintained at a temperature in excess of 1400° C. whereby to form a first layer of silicon carbide and a second layer of silicon of said one conductivity type on said wafer, removing said wafer from said melt, and forming a region of opposite-type conductivity in said silicon layer by a diffusion process.

References Cited in the file of this patent

UNITED STATES PATENTS

| | | |
|---|---|---|
| 2,428,537 | Veszi et al. | Oct. 7, 1947 |
| 2,537,255 | Brattain | Jan. 9, 1951 |
| 2,743,200 | Hannay | Apr. 24, 1956 |
| 2,743,201 | Johnson et al. | Apr. 24, 1956 |
| 2,929,859 | Lofershi | Mar. 22, 1960 |
| 2,937,324 | Kroko | May 17, 1960 |

FOREIGN PATENTS

| | | |
|---|---|---|
| 742,237 | Great Britain | Dec. 21, 1955 |

OTHER REFERENCES

Prince: Journal of Applied Physics, volume 26, No. 5, May 1955, pages 534–540.